United States Patent [19]

Mathewes, Jr. et al.

[11] Patent Number: 4,669,081
[45] Date of Patent: May 26, 1987

[54] LSI FAULT INSERTION

[75] Inventors: James K. Mathewes, Jr., Northborough; C. W. Gustav Eifrig, Framingham; Jan S. Herman, Holliston; H. Frank Howes, Berlin; Charles O. Schulz, Sudbury, all of Mass.

[73] Assignee: Raytheon Company, Lexington, Mass.

[21] Appl. No.: 825,849

[22] Filed: Feb. 4, 1986

[51] Int. Cl.$^4$ .................. G01R 31/28; G06F 11/00
[52] U.S. Cl. .................................. 371/3; 371/25; 371/27
[58] Field of Search .................. 371/3, 25, 27, 67, 23, 371/26, 15; 324/73 R, 73 AT; 364/200, 900

[56] References Cited

U.S. PATENT DOCUMENTS

| | | | |
|---|---|---|---|
| 3,761,695 | 9/1973 | Eichelberger | 235/153 AC |
| 3,783,254 | 1/1974 | Eichelberger | 235/152 |
| 3,784,907 | 1/1974 | Eichelberger | 324/57 DE |
| 3,961,251 | 6/1976 | Hurley et al. | 324/73 AT |
| 3,961,252 | 6/1976 | Eichelberger | 324/73 AT |
| 4,298,980 | 11/1981 | Hajdu et al. | 371/25 |
| 4,329,460 | 5/1982 | Reiner et al. | 324/73 R |
| 4,357,703 | 11/1982 | Van Brunt | 371/15 |
| 4,504,784 | 3/1985 | Goel et al. | 324/73 R |
| 4,519,078 | 5/1985 | Komonytsky | 371/25 |
| 4,561,095 | 12/1985 | Khan | 371/3 X |

OTHER PUBLICATIONS

R. L. Cormier, "Computer Fault Generator", IBM TDB vol. 11, No. 8. 1/1969, pp. 924–926.
A Logic Design Structure for LSI Testability, E. B. Eichelberger and T. W. Williams, 1977 *Design Automation Conference*, pp. 462–468.

Primary Examiner—Jerry Smith
Assistant Examiner—Robert W. Beausoliel, Jr.
Attorney, Agent, or Firm—Richard M. Sharkansky; Walter F. Dawson

[57] ABSTRACT

Apparatus and method for providing programmable fault insertion circuitry in a large scale integrated (LSI) circuit device thereby eliminating the need for external switches or relays to create faults. A fault parameter word is stored in a register and the outputs of the register are decoded to select the fault condition to be inserted by an interfacing circuit to the logic being tested. Test vectors and the fault parameter word are generated by a controller coupled to the integrated circuit and a test response from the integrated circuit is examined by the controller.

29 Claims, 8 Drawing Figures

LSI FAULT INSERTION

BACKGROUND OF THE INVENTION

This invention relates generally to the testing of integrated semiconductor logic circuits including large scale integrated (LSI) circuits and very large scale integrated (VLSI) circuits (hereinafter referred to collectively as LSI circuits) using logic scan design (LSD) techniques and in particular to providing programmable fault insertion logic within the LSI circuit, and modules and systems comprising the LSI circuits, for verifying fault detection capability.

With the advent of large scale integration improved methods of testing LSI circuits have been deviced to accomplish a reliable level of testing to measure the performance of a functional integrated circuit (IC) chip or a plurality of said chips in a module under test. Prior to the existence of LSI the AC parameters of circuits on an integrated circuit chip were measured such as the rise time, fall time, individual circuit delay, etc., in addition to performing DC measurements. The packaging of an LSI chip can accommodate only a limited number of input-output pins thereby limiting the amount of parametric and functional testing that can be performed on an LSI device comprising large quantities of conventional logic design.

One of the known test methods for testing LSI devices and systems employing LSI devices is Level Sensitive Scan Design (LSSD) which is described in U.S. Pat. Nos. 3,761,695, 3,783,254, 7,784,907 and in the publication "A Logic Design Structure for LSI Testability" by E. B. Eichelberger and T. W. Williams, 14th Design Automation Conference Proceedings, IEEE Computer Society, June 20-22, 1977, pages 462-468. In a system employing LSSD, a logic system is defined as being "level sensitive" if, and only if, the steady state response to any allowed input state change is independent of the circuit and wire delays within the system. Also, if an input stage change involves the changing of more than one input signal, then the response must be independent of the order in which they change. A level sensitive system is assumed to operate as a result of a sequence of allowed input changes with sufficient time lapse between changes to allow the system to stabilize in the new internal state. To implement a level sensitive system, the logic organization is such that all internal storage elements function as shift register latches or portions of shift register latchs having access and controls independent of the system access and controls thereby transforming sequential circuits into combinational circuits. Thus, LSSD testing is performed by shifting test data via a scan-in input into a serial chain of logic on an LSI device having storage elements implemented with shift register latches, applying test vectors to the primary inputs of the device under test, and shifting the data out via a scan-out output to compare it to known good test data.

In addition to the testing of LSI devices via an LSD or LSSD technique that arranges for all internal logic states to be held in registers that can be serially accessed allowing the internal states to be observed and controlled, it is also important to be able to verify and demonstrate that a testing method being used does indeed detect a failure condition in an LSI circuit in the manner expected. Such testing and verification are also required for the next two levels of integration wherein a plurality of LSI circuits are mounted on a module card and a plurality of module cards are assembled into a system.

SUMMARY OF THE INVENTION

In accordance with the present invention fault insertion circuitry is resident in a large scale integrated (LSI) circuit comprising a plurality of logic arranged for internal logic states to be held in serially accessed registers which are observable and controllable. The fault insertion circuitry provides programmable "stuck at one" and "stuck at zero" fault conditions, and comprises a fault word register having a serial input, a serial output and a parallel output for storing a fault parameter word. The fault word register is serially coupled into an input line to the serially accessed registers forming a logic scan design (LSD) chain. Fault generation means are coupled between the parallel output of the fault word register and the plurality of logic being tested for generating one of a plurality of fault conditions specified by the fault parameter word. The fault insertion circuitry also provides a fault condition for disabling a tri-state driver or set of tri-state drivers.

In accordance with a further feature of the invention, fault insertion circuitry resident in a large scale integrated (LSI) circuit provides the means for a test system to verify fault detection in such an integrated circuit having a plurality of logic arranged for internal logic states to be held in serially accessed registers which are observable and controllable. The fault insertion circuitry resident in the integrated circuit comprises a register having a serial input, a serial output and a parallel output for storing a fault parameter word, the register being serially coupled into an input line to the serially accessed registers, and fault generation means coupled between the parallel output of the register and the plurality of logic for generating a fault condition specified by the fault parameter word. A bit maintenance controller is connected to the integrated circuit for providing a first test vector including the fault parameter word to the input line of the integrated circuit and a second test vector word to other data inputs of the integrated circuit. The Bit Maintenance Controller tests a response from a serial output line and data outputs of the integrated circuit resulting from the insertion of a fault condition.

A further feature of the invention includes a method of fault insertion in a large scale integrated circuit, including a plurality of logic arranged for internal logic states to be held in serially accessed registers which are observable and controllable, by programamble fault insertion circuitry resident in the integrated circuit comprising the steps of storing a fault parameter word in a register having a serial input, a serial output and a parallel output, such register being serially coupled into an input line to the serially accessed registers, generating a fault condition specified by the fault parameter word, and coupling the fault condition to the plurality of logic being tested. The step of generating a fault condition comprises the step of generating a stuck at a logic one level signal or a stuck at a logic zero level signal or generating a disabling signal for a tri-state driver.

Other features and advantages of the present invention will become apparent in the detailed description appearing hereinafter.

BRIEF DESCRIPTION OF THE DRAWINGS

Other and further features and advantages of the invention will become apparent in connection with the accompanying drawings wherein.

DESCRIPTION OF THE PREFERRED EMBODIMENT

Figure 1:
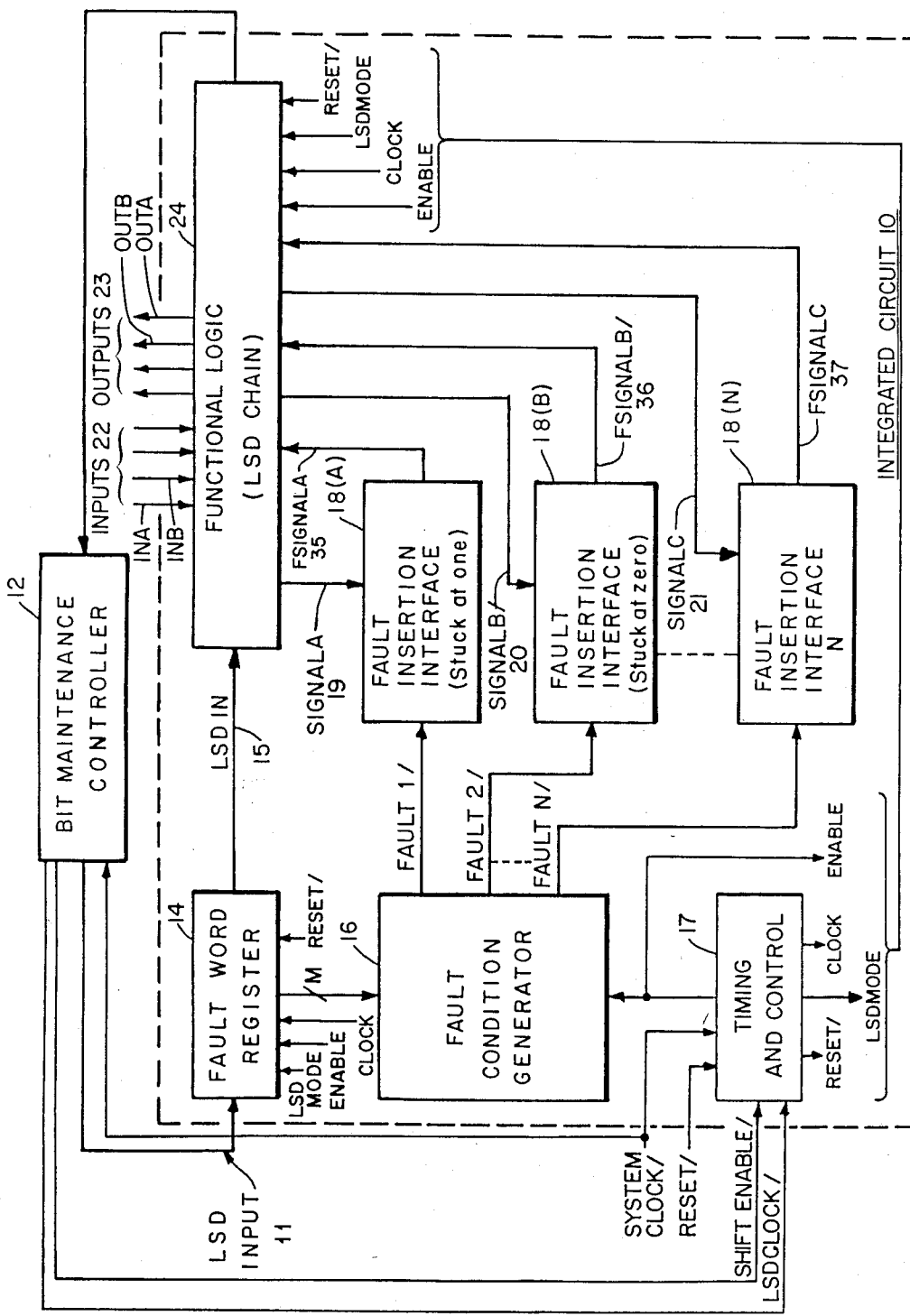
FIG. 1 is a functional block diagram of the invention showing fault insertion circuitry coupled to an LSD chain of an integrated circuit.

Referring to FIG. 1, there is shown a block diagram of an integrated circuit 10 comprising a logic scan design (LSD) chain 24 and fault insertion interface means 18(A)–18(N) for inserting fault conditions into said LSD chain 24. The LSD chain 24 comprises a serial interconnection of a functional logic design present on the integrated circuit 10. The logic design is implemented such that all internal logic states are held in registers that can be serially accessed allowing the internal states to be obesrved and controlled. Therefore, controllability and observability of an LSI circuit no longer depends on the number of pins on an integrated circuit package.

Figure 5:
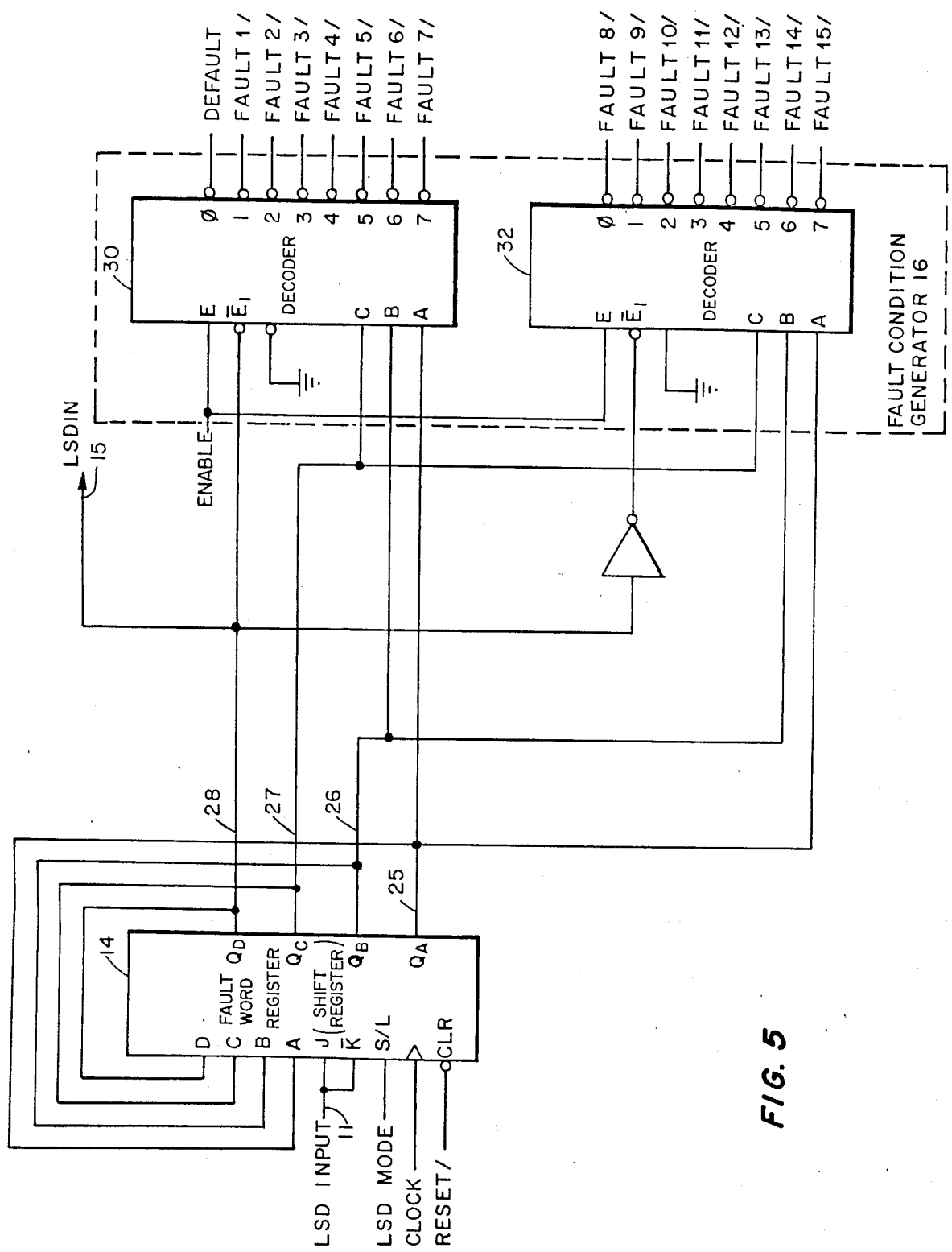
FIG. 5 is a detailed functional block diagram of a fault word register coupled to a fault condition generator of the invention.

A fault parameter word is loaded into a fault word register 14 via an LSD input 11 of the integrated circuit 10. A serial output (LSDIN) on line 15 from the fault word register 14 is coupled to the functional logic LSD chain 24 and a parallel output having M bits of the fault word register 14 is coupled to a fault condition generator 16. The fault parameter word is generated along with all testing parameters by a BIT maintenance controller 12 which is externally coupled between the LSD INPUT 11 and an LSD OUTPUT 13 of the integrated circuit 10. The fault condition generator 16 generates a plurality of fault conditions FAULT1/ to FAULTN/ depending on the number of bits M in the fault word register 14 and the decoding provided by the fault condition generator 16 selects the fault condition specified by the fault parameter word. With a four bit fault parameter word in the present preferred embodiment, 15 fault conditions are readily generated as shown in FIG. 5 in addition to a DEFAULT or no fault state condition. (A slash "/" after a signal name such as FAULT1/ indicates that the signal is asserted when the signal is at a 0V level). Each of the fault conditions is coupled to a fault insertion interface 18(A)–18(N) which provides the proper signal level to be inserted into the functional logic LSD chain 24 creating a "stuck at one" fault, a "stuck at zero" fault or an output disabling signal for tri-state drivers. A stuck at one fault access occurs when a fault signal such as FSIGNALA generated by fault insertion interface 18(A) asserts a logic one level and a stuck at zero fault occurs when a fault signal such as FSIGNALB/ generated by fault insertion interface 18(B) asserts a logic zero level.

Still referring to FIG. 1 the BIT maintenance controller (BMC) 12 sets up a serial test vector word and appends the fault parameter word of the fault to be examined at the end of the test vector word transmission. After transmitting the test vector word, the BMC 12 disables the test mode and generates a single SYSTEM CLOCK to determine the response to this stimulus. An LSD chain 24 response to the SYSTEM CLOCK and fault insertion is determined by the BMC 12 shifting out an LSD chain word from the intgrated circuit 10 and at the same time shifting in a new test vector or returning the IC 10 to its original logic condition. During some operational tests a fault may be left inserted while system testing proceeds (i.e. to isolate an error in a tri-state driver when one of two tri-state drivers which have interconnected outputs may be disabled to determine which one is causing the failure). The BMC 12 interfaces with both the fault word register 14 and the timing and control 17 of the IC 10. The timing and control 17 receives SHIFT ENABLE/ AND LSDCLOCK/ timing signals from the BMC 12. The SHIFT ENABLE/ signal in conjunction with the LSDCLOCK/ causes the generation of timing signals to shift the serial LSD INPUT 11 from the BIT maintenance controller 12 into the integrated circuit 10.

Figure 2:
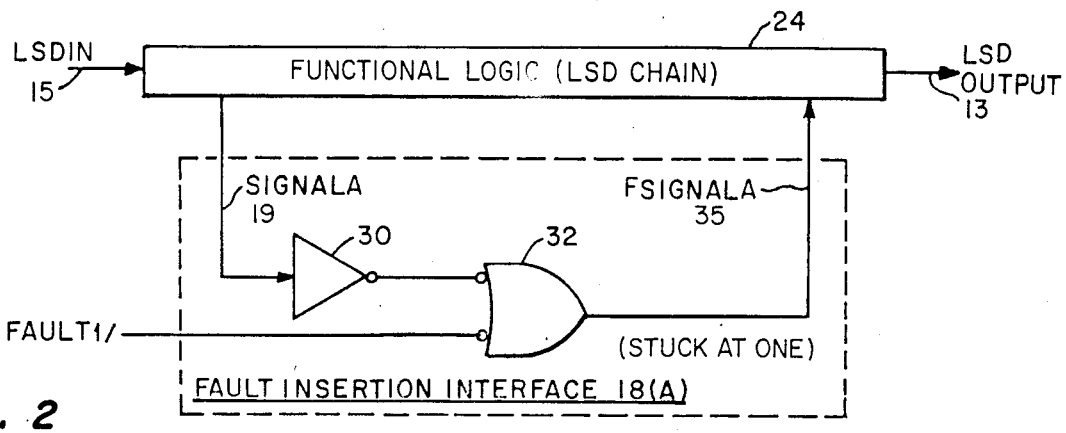
FIG. 2 shows a fault insertion interface logic for generating a stuck at one fault condition.
Figure 3:
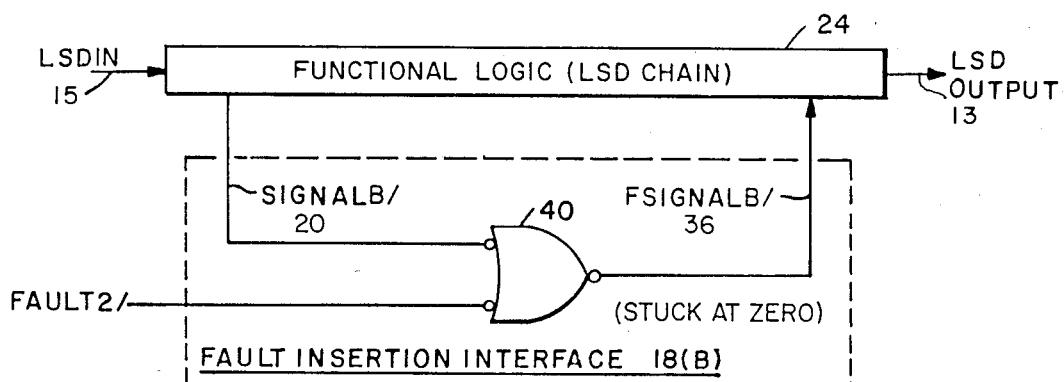
FIG. 3 shows a fault insertion interface logic for generating a stuck at zero fault condition.
Figure 4:
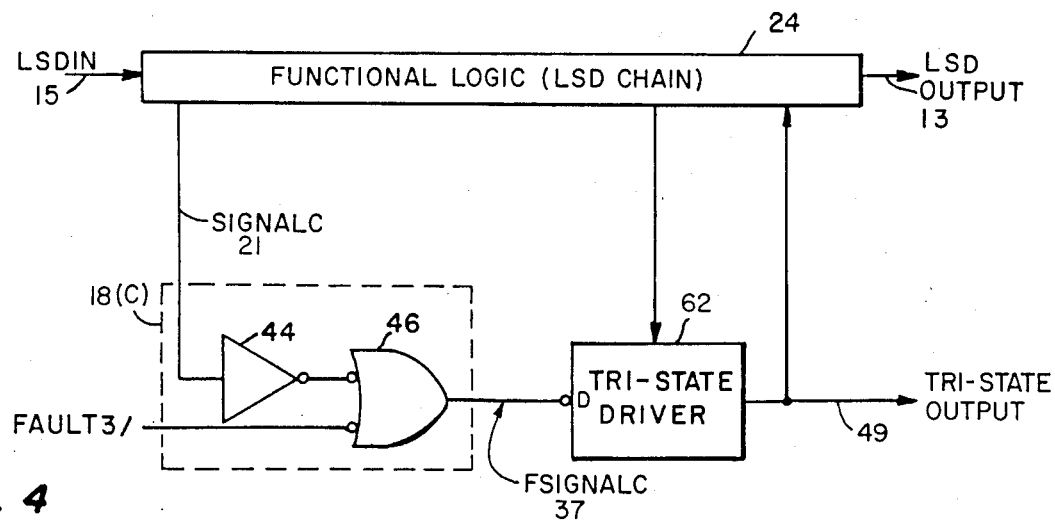
FIG. 4 illustrates the use of the fault insertion interface of FIG. 2 for generating a disable condition for a tri-state driver.

Referring now to FIGS. 2, 3 and 4, a fault insertion interface 18(A) required to create a stuck at one condition for SIGNALA on line 19 is shown in FIG. 2 comprising an inverter 30 and an OR gate 32 with inverting inputs and an output FISGNALA on line 35 coupled to the functional logic LSD chain 24. When FAULT1/ is not asserted, FSIGNALA responds in accordance with SIGNALA, but when FAULT1/ is asserted, FSIGNALA is stuck at one for as long as FAULT1/ is asserted. The fault insertion interface 18(B) as shown in FIG. 3 comprises a NOR gate 40 with inverting inputs and an output FSIGNALB/ on line 36 coupled to the functional logic LSD chain 24 for creating a stuck at zero fault condition. When FAULT2/ is not asserted, then FSIGNALB/ responds in accordance with SIGNALB/; however, when FAULT2/ is asserted, the FSIGNALB/ is stuck at zero for as long as FAULT2/ is asserted. FIG. 4 shows the use of a fault insertion interface 18(C) similar to 18(A) comprising inverter 44 coupled to OR gate 46 with inverting inputs and an FSIGNALC output on line 37 coupled to the disable (D) input of a tri-state driver 48 which provides a means of testing a plurality of tri-state drivers connected together at a tri-state output line 49 by disabling certain ones of the connected tri-state drivers.

Referring now to FIG. 5 a functional block diagram is shown of the fault word register 14 having four (4) parallel output lines 25–28 coupled to the fault condition generator 16 where said output lines are decoded by decoders 30, 32 into fifteen fault conditions FAULT1/ to FAULT15/ and a DEFAULT state (i.e. no fault inserted) which occurs during the normal operation of integrated circuit 10. The fault word register 14 is embodied with a 4-bit parallel access shift register LSI macrocell (similar to a 74LS95A manufactured by Texas Instruments of Dallas, Texas) and the fault condition generator 16 is embodied with a pair of 3 to 8 line decoder macrocells (similar to the 74LS138 manufactured by Texas Instruments of Dallas, Texas). The decoders 30, 32 are disabled during the LSD shift time via the timing signal ENABLE by forcing the DEFAULT state. The fault word register 14 is loaded with a particular fault parameter word by serially tagging said fault word on the end of a test vector generated by the BIT maintenance controller 12 whereby the test vector is serially loaded into the functional logic LSD chain 24 of integrated circuit 10 via the LSD input line 11 and the fault parameter word portion is loaded into the fault word register 14. When multiple LSI devices are placed on a substrate or module, each device has a separate fault word register and LSD chain. In such substrate or module the Bit Maintenance Controller 12 has to increase the word bit length of the serially transmitted test vectors for performing tests. Single fault insertion requires the fault word registers in the unaffected multiple LSI devices to be in their DEFAULT condition.

Figure 6A:
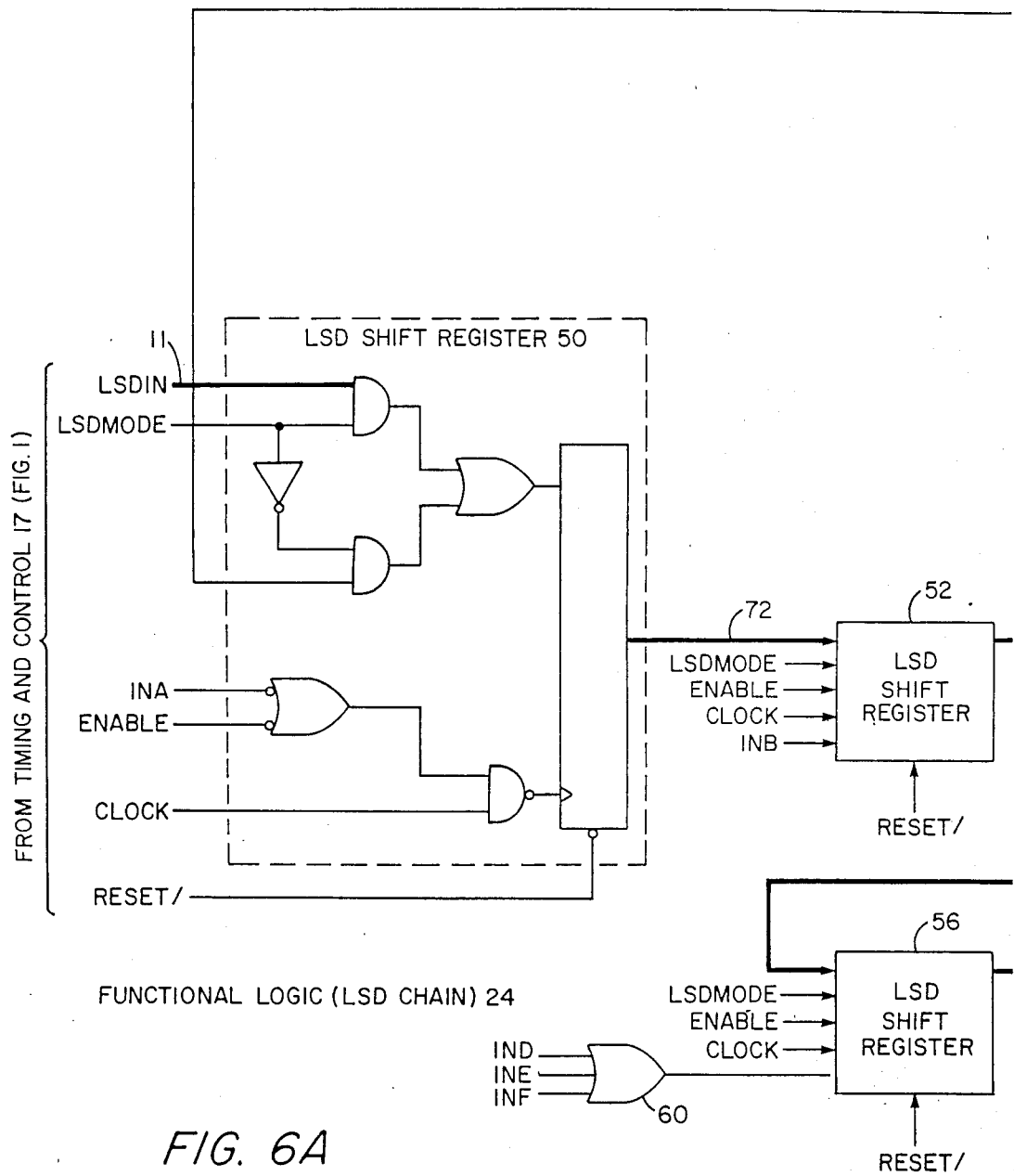
FIG. 6A and FIG. 6B show a detailed block diagram of functional logic comprising an LSD chain of shift registers and fault insertion signals provided to the logic.
Figure 6B:
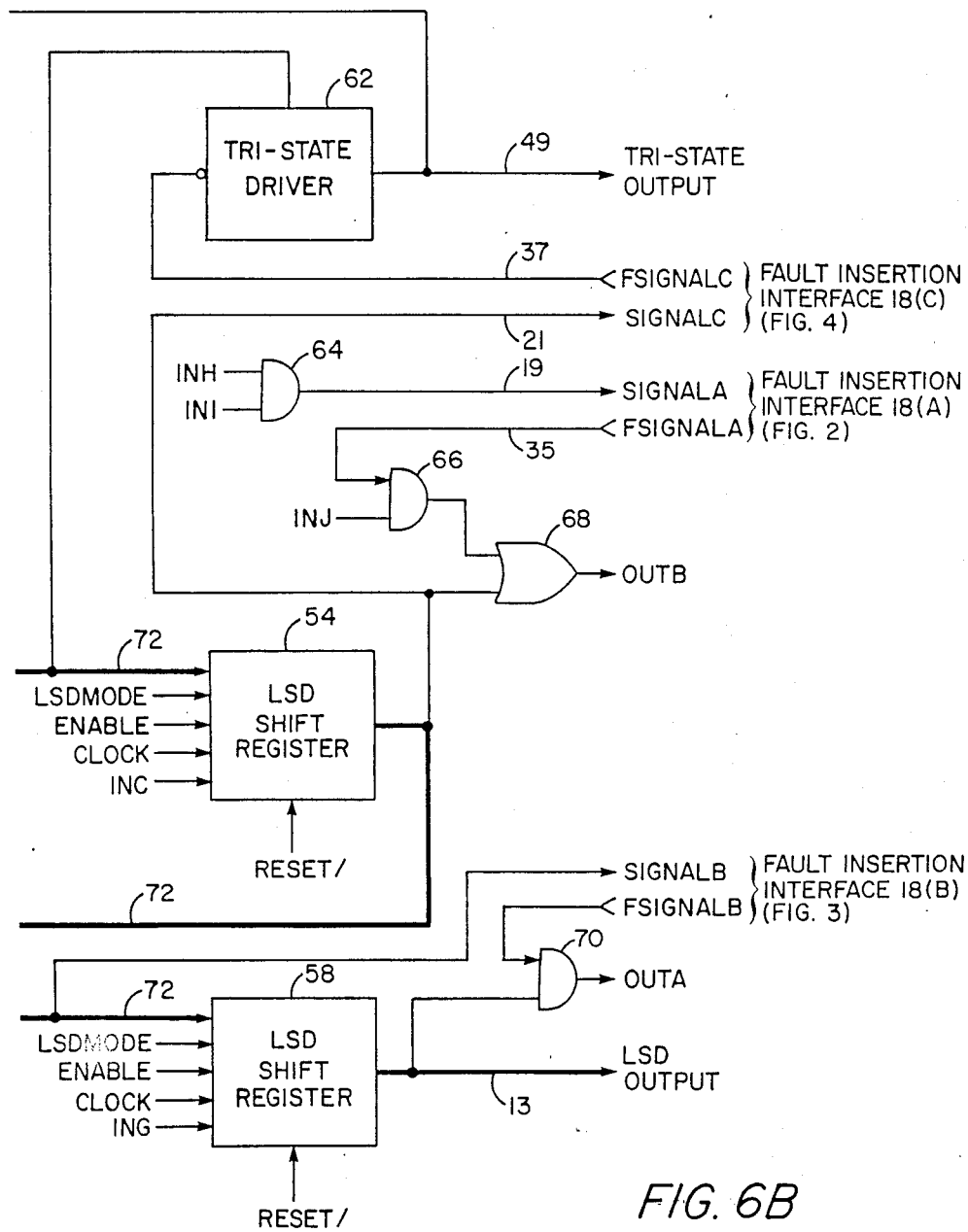

Referring now to FIGS. 6A and 6B, a detailed block diagram of the functional logic LSD chain 24 is shown comprising five storage elements implemented with LSD shift registers 50-58. In addition, gating logic 64-70 is shown along with a tri-state driver 62. The gating logic 64-70 and tri-state driver 62 are coupled to fault insertion interfaces 18(A), 18(B) and 18(C) which shows the best mode use of the invention with exemplary functional logic 24. The LSD shift registers 50-58 are serially coupled together which is readily seen by observing the wider line 72 interconnecting the shift registers in FIGS. 6A and 6B. The LSD functional mode of each shift register is determined by the LSDMODE signal and other control signals include ENABLE, CLOCK and RESET/. A serial test vector is loaded into the LSD shift registers 50-58 via the LSDIN input line 11 and a serial output is obtained via the LSD output line 13. The logic implementation for the LSD shift register 50 is known to one of ordinary skill in the art as shown in FIGS. 6A and 6B and all other shift registers 52-58 are implemented similarly. The serial interconnection of the storage elements on an LSI circuit provides for observing and controlling each storage bit. The creation of stuck at one and stuck at zero logic level failure conditions on the IC 10 provide a means for demonstrating and verifying fault detection software.

Still referring to FIGS. 6A and 6B, two types of logic faults may be inserted along with a signal to facilitate the investigation of a failure with tri-state drivers. The SIGNALA output of AND gate 64 is coupled to fault insertion interface 18(A) (FIG. 2) which generates FSIGNALA on line 35. FSIGNALA is coupled to an input of AND gate 66. SIGNALA and FSIGNALA are essentially the same logic signal except that the fault insertion interface 18(A) can cause FSIGNALA to be stuck at a one logic level if the FAULT1/ is generated at the input to fault insertion interface 18(A). The SIGNALB/ output from LSD shift register 56 is coupled to fault insertion interface 18(B) (FIG. 3) which generates FSIGNALB/ on line 36. FSIGNALB is coupled to an input of AND gate 70 in the functional logic LSD chain 24. SIGNALB/ and FSIGNALB/ are essentially the same logic signal except that the fault insertion interface 18(B) can cause FSIGNALB to be stuck at a zero logic leve if the FAULT2/ is generated at the input to fault insertion interface 18(B). Outputs such as OUTA from AND gate 70 and OUTB from OR gate 68 may be observed at OUTPUTS 23 shown in FIG. 1 which are observable by the Bit Maintenance Controller 12 or by including such outputs as part of the LSD chain formed by line 72. Signals such as OUTA and OUTB are analyzed after a fault is inserted to assist in isolating the inserted fault condition. A tri-state driver 62 has a TRI-STATE OUTPUT on line 49 which is typically connected to the output of one or more other tri-state drivers forming a bus network. If a failure is to be inserted in one of the interconnected tri-state drivers, it is necessary to disable or turn-off all except one of the tri-state drivers connected together to isolate the failure to a particular driver. In the present embodiment, tri-state driver 62 can be disabled by FSIGNALC on line 37 which is generated by fault insertion interface 18(C) (FIG. 4) when SIGNALC is asserted on line 21 and a FAULT3/ is generated.

Figure 7:
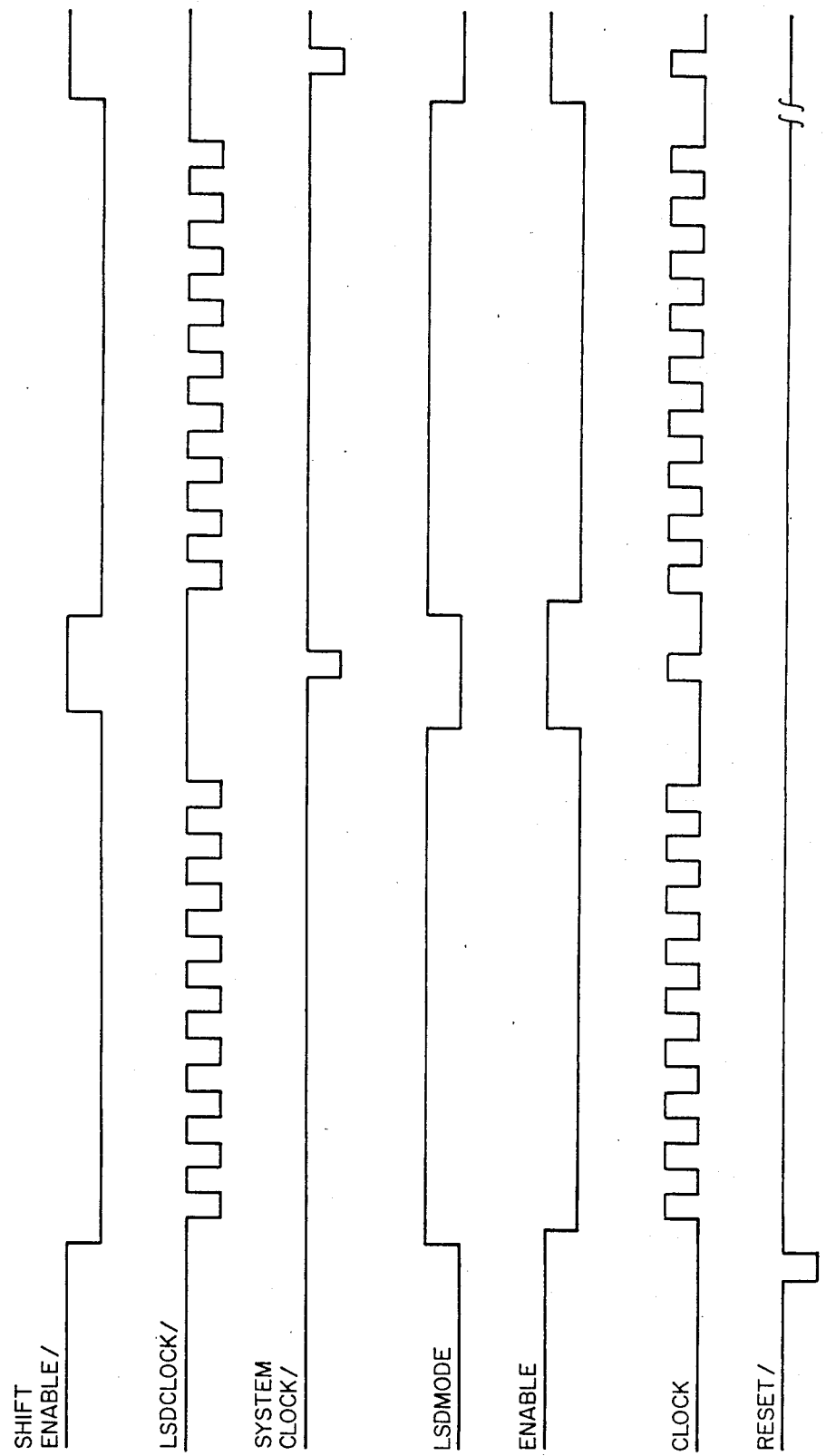
FIG. 7 shows the timing and control signals required for operation of the LSD chain shown in FIG. 6 and LSI fault insertion testing.

Referring now to FIG. 7, the timing and control signals are shown that are required for a fault insertion LSD test of the functional logic shown in FIGS. 6A and 6B. There are five storage elements (i.e. LSD shift registers 50-58) and a 4-bit fault word register 14 thereby requiring nine clock pulses to shift a nine-bit serial test vector word from the BMC 12 into IC 10. The first five bits provide test information to the LSD shift registers 50-58 and the last four bits are loaded into the fault word register 14 for fault insertion selection. A SHIFT ENABLE/ and an LSDCLOCK/ signals are generated by the BMC 12 and are provided to the timing and control 17 on the IC 10. Also, provided to the timing and control 17 are SYSTEM CLOCK/ and RESET/ signals which are generated within the system employing the IC 10. Based on these supplied timing signals, the on chip timing and control 17 generates LSDMODE, ENABLE AND CLOCK signals for operation of the LSD shift registers 50-58, the fault word register 14 and the fault condition generator 16. The SHIFT ENABLE/ along with the LSDCLOCK/ provide for shifting the serial test vector word which in this embodiment comprises 9-bits from the BMC 12 to the IC 10. At the conclusion of the shifting, the BMC 12 generates a single SYSTEM CLOCK/ pulse which loads the response to the test vector word into the LSD shift registers 50-58. Then the contents of the LSD shift registers 50-58 and fault word register 14 are shifted out to the BMC 12 via LSD output 13 to determine the correct response to the inserted fault as specified by the fault parameter word portion of the test vector word. FIG. 7 shows the timing relationships during the insertion of two separate fault conditions. The Bit Maintenance Controller 12 examines the result of the first fault insertion at the conclusion of the second SYSTEM CLOCK/ because the test result is not shifted out until the conclusion of the second set of LSD CLOCK/ pulses. It is possible for the BMC 12 to examine the test result of the first fault condition at the conclusion of the first SYSTEM CLOCK/ if test points are provided for further isolation of a specific fault condition.

This concludes the description of the preferred embodiment. However, many modifications and alterations will be obvious to one of ordinary skill in the art without departing from the spirit and scope of the inventive concept. For example, the size of the fault word register is determined by the number of fault conditions to be generated; also, the number of LSD CLOCK/ pulses required to shift a serial test vector word into IC 10 is a function of the number of LSD shift registers, the number of bits in the fault word register, and the number of devices located on a substrate or module under test. Therefore, it is intended that the scope of this invention be limited only by the appended claims.

What is claimed is:

1. In a large scale integrated circuit including a plurality of logic arranged for internal logic states to be held in serially accessed registers which are observable and controllable, fault insertion circuitry resident in said integrated circuit comprising:

register means having a serial input, a serial output and a parallel output for storing a fault parameter word, said register means being serially coupled into an input line to said serially accessed registers; and fault generation means coupled between said parallel output of said register means and said plurality of logic for generating a fault condition specified by said fault parameter word.

2. The fault insertion circuitry as recited in claim 1 wherein:
said register means provides for fault programmability in response to said fault parameter word.

3. The fault insertion circuitry as recited in claim 1 wherein:
said fault generation means comprises decoding means for selecting said fault condition.

4. The fault insertion circuitry as recited in claim 1 wherein:
said fault generation means comprises means for interfacing said fault condition to said plurality of logic.

5. The fault insertion circuitry as recited in claim 1 wherein:
said fault condition comprises a signal stuck at a logic one level.

6. The fault insertion circuitry as recited in claim 1 wherein:
said fault condition comprises a signal stuck at a logic zero level.

7. The fault insertion circuitry as recited in claim 1 wherein:
said fault condition comprises disabling a tri-state driver means.

8. In a large scale integrated circuit including a plurality of logic arranged for internal logic states to be held in serially accessed registers which are observable and controllable, fault insertion circuitry resident in said integrated circuit comprising:

register means having a serial input, a serial output and a parallel output for storing a fault parameter word, said register means being serially coupled into an input line of said serially accessed registers;

means coupled to said parallel output of said register means for decoding said fault parameter word thereby asserting one of a plurality of fault conditions specified by said fault parameter word; and means coupled to said decoding means and said plurality of logic for interfacing each fault condition to a portion of said logic being tested.

9. The fault insertion circuitry as recited in claim 8 wherein:
said register means provides fault programmability in response to said fault parameter word.

10. The fault insertion circuitry as recited in claim 8 wherein:
a first one of said interfacing means provides a stuck at one logic level to a first portion of said logic being tested in response to a first one of said fault conditions; and a second one of said interfacing means provides a stuck at zero logic level to a second portion of said logic being tested in response to a second one of said fault conditions.

11. The fault insertion circuitry as recited in claim 8 wherein:
a third one of said interfacing means provides a disable signal for testing tri-state driver means coupled together at a common output, said disable signal disabling at least one of said tri-state driver means.

12. A fault insertion test system for verifying fault detection in an integrated circuit having a plurality of logic arranged for internal logic states to be held in serially accessed registers which are observable and controllable comprising:

fault insertion circuit means resident in said integrated circuit comprising (a) register means having a serial input, a serial output and a parallel output for storing a fault parameter word, said register means being serially coupled into an input line to said serially accessed registers and (b) fault generation means coupled between said parallel output of said register means and said plurality of logic for generating a fault condition specified by said fault parameter word; and controlling means coupled to said integrated circuit for providing a first test vector word and said fault parameter word to said input line, a second test vector word to data inputs of said integrated circuit, and testing a response from a serial output line and data outputs of said integrated circuit resulting from said fault insertion condition.

13. The fault insertion test system as recited in claim 12 wherein:
said register means provides fault programmability in response to said fault parameter word.

14. The fault insertion test system as recited in claim 12 wherein:
said fault generation means provides a stuck at one logic level fault condition to said logic being tested.

15. The fault insertion test system as recited in claim 12 wherein:
said fault generation means provides a stuck at zero logic level fault condition to said logic being tested.

16. The fault insertion test system as recited in claim 12 wherein:
said fault generation means provides a disable signal for testing tri-state driver means coupled together at a common output, said disable signal disabling at least one of said driver means.

17. The method of fault insertion in a large scale integrated circuit, including a plurality of logic arranged for internal logic states to be held in serially accessed registers which are observable and controllable, by fault insertion circuitry resident in said integrated circuit comprising the steps of:

storing a fault parameter word in a register means having a serial input, a serial output and a parallel output, said register means being serially coupled into an input line to said serially accessed registers;

generating a fault condition specified by said fault parameter word; and coupling said fault condition to said plurality of logic.

18. The method as recited in claim 17 wherein:
said step of generating a fault condition comprises the step of generating a stuck at a logic one level signal.

19. The method as recited in claim 17 wherein:

said step of generating a fault condition comprises the step of generating a stuck at a zero level signal.

20. The method as recited in claim 17 wherein:
said step of generating a fault condition comprises the step of generating a disabling signal for a tri-state driver means.

21. The method of fault insertion in a large scale integrated circuit, including a plurality of logic arranged for internal logic states to be held in serially accessed registers which are observable and controllable, by fault insertion circuitry resident in said integrated circuit comprising the steps of:
providing a fault parameter word to a register means having a serial input, a serial output and a parallel output, said register means being serially coupled into an input line to said serially accessed registers;
decoding said fault parameter word available at said parallel output of said register means for asserting one of a plurality of fault conditions; and
interfacing each of said fault conditions to a portion of said logic being tested.

22. The method as recited in claim 21 wherein:
said step of interfacing said fault conditions to said logic being tested comprises the step of providing a stuck at one logic level signal.

23. The method as recited in claim 21 wherein:
said step of interfacing said fault conditions to said logic being tested comprises the step of providing a stuck at a zero logic level signal.

24. The method as recited in claim 21 wherein:
said step of interfacing said fault conditions to said logic being tested comprises the step of providing a disable signal to tri-state driver means having common outputs coupled together, whereby said disable signal disables at least one of said tri-state driver means.

25. The method of fault insertion for verifying fault detection in a large scale integrated circuit having a plurality of logic arranged for internal logic states to be held in serially accessed registers which are observable and controllable, by fault insertion circuitry resident in said integrated circuit comprising:
loading a first test vector word into said serially accessed registers;
providing a second test vector word to data inputs of said integrated circuit;
storing a fault parameter word in a register means having a serial input, a serial output and a parallel output, said register means being serially coupled into an input line to said serially accessed registers;
decoding said fault parameter word for asserting one of a plurality of fault conditions;
interfacing each of said fault conditions to a portion of said logic being tested; and
testing a response from a serial output line and data outputs of said integrated circuit resulting from said first and second test vectors and said fault insertion conditions provided by said fault parameter word to said serial input line.

26. The method as recited in claim 25 wherein:
said step of testing a response to said first and second test vectors and said fault insertion conditions includes using a controlling means coupled to said integrated circuit for providing said test vectors and fault conditions and examining said response.

27. The method as recited in claim 25 wherein:
said step of interfacing said fault conditions to said logic being tested comprises the step of providing a stuck at a one logic level signal.

28. The method as recited in claim 25 wherein:
said step of interfacing said fault conditions to said logic being tested comprises the step of providing a stuck at a zero logic level signal.

29. The method as recited in claim 25 wherein:
said step of interfacing said fault conditions to said logic being tested comprises the step of providing a disable signal to tri-state driver means having common outputs coupled together whereby said disable signal disables at least one of said tri-state driver means.

* * * * *